United States Patent
Yang et al.

(10) Patent No.: US 7,198,747 B2
(45) Date of Patent: Apr. 3, 2007

(54) FABRICATION OF CERAMIC MICROSTRUCTURES

(75) Inventors: Hong Yang, Rochester, NY (US); Pascal Deschatelets, Troy, NY (US); George M. Whitesides, Newton, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 09/940,072

(22) Filed: Aug. 27, 2001

(65) Prior Publication Data

US 2002/0076575 A1 Jun. 20, 2002

Related U.S. Application Data

(60) Provisional application No. 60/233,156, filed on Sep. 18, 2000.

(51) Int. Cl.
*B23B 1/00* (2006.01)
*C04B 35/64* (2006.01)

(52) U.S. Cl. .................. 264/273; 264/274; 264/275

(58) Field of Classification Search ............... 264/621, 264/624, 625, 626, 653, 39, 234, 273–275, 264/287, 290, 290.2
See application file for complete search history.

(56) References Cited

U.S. PATENT DOCUMENTS

| 3,873,359 A | 3/1975 | Lando |
| 3,873,360 A | 3/1975 | Lando |
| 3,900,614 A | 8/1975 | Lando |
| 4,073,981 A | 2/1978 | Baron |
| 4,098,922 A | 7/1978 | Dinella et al. |
| 4,192,764 A | 3/1980 | Madsen |
| 4,250,127 A * | 2/1981 | Warren et al. ............. 264/494 |
| 4,258,001 A | 3/1981 | Pierce et al. |
| 4,472,458 A | 9/1984 | Sirinyan et al. |
| 4,508,755 A | 4/1985 | Reintjes et al. |
| 4,555,414 A | 11/1985 | Hoover et al. |
| 4,687,657 A | 8/1987 | Clark et al. |
| 4,690,715 A | 9/1987 | Allara et al. |
| 4,764,489 A | 8/1988 | Bolt |
| 4,869,854 A | 9/1989 | Takeda et al. |
| 4,886,700 A * | 12/1989 | Younes ........................ 442/180 |
| 4,959,252 A | 9/1990 | Bonnebat et al. |
| 4,994,219 A * | 2/1991 | Yeh ............................. 264/659 |

(Continued)

FOREIGN PATENT DOCUMENTS

DE 196 05 521 C1 7/1997

(Continued)

OTHER PUBLICATIONS

H.J. Ritzhaupt-Kleissl, et al., "Development of ceramic microstructures," *Microsystems Technologies*, vol. 2, (1996), pp. 130-134.

(Continued)

*Primary Examiner*—Steven P. Griffin
*Assistant Examiner*—Carlos Lopez
(74) *Attorney, Agent, or Firm*—Wolf, Greenfield, & Sacks, P.C.

(57) ABSTRACT

The invention provides ceramic molded solid articles and methods for making these articles on the micron scale. Articles are molded from ceramic precursors, optionally using molds including at least one portion that is elastomeric.

62 Claims, 5 Drawing Sheets

U.S. PATENT DOCUMENTS

| | | | |
|---|---|---|---|
| 5,073,495 | A | 12/1991 | Anderson |
| 5,079,600 | A | 1/1992 | Schnur et al. |
| 5,087,510 | A | 2/1992 | Tokas et al. |
| 5,141,785 | A | 8/1992 | Yoshinada et al. |
| 5,170,461 | A | 12/1992 | Yoon et al. |
| 5,210,058 | A | 5/1993 | Takeda et al. |
| 5,219,925 | A * | 6/1993 | Stephens .................... 524/860 |
| 5,227,474 | A | 7/1993 | Johnson et al. |
| 5,252,684 | A | 10/1993 | Zank et al. |
| 5,259,926 | A | 11/1993 | Kuwabara et al. |
| 5,296,418 | A | 3/1994 | Takeda et al. |
| 5,312,942 | A | 5/1994 | Jansen et al. |
| 5,340,515 | A * | 8/1994 | Fain et al. .................. 264/414 |
| 5,345,869 | A | 9/1994 | Treverton et al. |
| 5,385,116 | A | 1/1995 | Hattori et al. |
| 5,386,006 | A | 1/1995 | Masumoto et al. |
| 5,405,982 | A | 4/1995 | Loffelholz |
| 5,439,829 | A | 8/1995 | Anderson et al. |
| 5,453,527 | A | 9/1995 | Baldus et al. |
| 5,471,455 | A | 11/1995 | Jabr |
| 5,484,324 | A | 1/1996 | Okabayashi et al. |
| 5,512,131 | A | 4/1996 | Kumar et al. |
| 5,543,485 | A | 8/1996 | Baldus |
| 5,620,850 | A | 4/1997 | Bamdad et al. |
| 5,676,906 | A * | 10/1997 | Hirata ........................ 264/430 |
| 5,698,485 | A | 12/1997 | Bruck et al. |
| 5,700,411 | A | 12/1997 | Furlani et al. |
| 5,735,985 | A | 4/1998 | Ghosh et al. |
| 5,834,388 | A | 11/1998 | Baldus et al. |
| 5,860,467 | A * | 1/1999 | DeSimone et al. ............ 164/5 |
| 5,866,705 | A | 2/1999 | Jansen et al. |
| 5,893,206 | A * | 4/1999 | Furlani et al. ................ 29/608 |
| 5,919,572 | A * | 7/1999 | Blum et al. |
| 5,985,430 | A | 11/1999 | Baldus et al. |
| 6,039,897 | A | 3/2000 | Lochhead et al. |
| 6,143,412 | A | 11/2000 | Schueller et al. |

FOREIGN PATENT DOCUMENTS

| | | |
|---|---|---|
| DE | 197 12 442 A1 | 10/1998 |
| EP | 0112721 A2 | 12/1983 |
| EP | 0672765 A1 | 3/1995 |
| EP | 07237229 | 12/1995 |
| GB | 2 262 465 A | 6/1993 |
| JP | 06 090738 A | 4/1994 |
| WO | WO 96/29629 A2 | 9/1996 |
| WO | WO 98/34886 A1 | 8/1998 |
| WO | WO 00/26157 A1 | 5/2000 |

OTHER PUBLICATIONS

F. Noker et al., "Herstellung von Mikrostrukturkorpern aus Keramik," 12222 Keramische Zeitschrift, vol. 44 (1992), No. 10, pp. 677-681.

J.M. Hruby, et al., "LIGA: Metals, Plastics, and Ceramics," SPIE, vol. 3874, (1999), pp. 32-43.

H. Freimuth, et al., "Formation of Complex Ceramic Miniaturized Structures by Pyrolysis of Poly(vinylsilazane)," J. Am. Ceram. Soc., vol. 79, No. 6, pp. 1457-1465.

H. Yang, et al., "Fabrication of High Performance Ceramic Microstructures from a Polymeric Precursor Using Soft Lithography," Advanced Materials, vol. 13, (2001), No. 1, pp. 54-58.

Jungermann, Hardy eta l., "Synthesis of an extremely stable ceramic in the system Si/B/C/N using 1-(trichlorosily1)-1-(dichloroboryl)ethane as a single-source precursor", Mat. Res. Innova vol. 2, pp. 200-206 (1999).

Baldus, Hans-Peter et al., "Novel High-Performance ceramics-Amorphous Inorganic Networks from Molecular Precursors", Angew. Chem. Int. Ed. Engl. vol. 36, pp. 328-343 (1997).

Weinmann, Marku et al., "Synthesis and Thermal Behavior of Novel Si-B-C-N Ceramic Precursors", Chem. Mater. vol. 12, pp. 623-632 (2000).

Riedel, Ralf et al., "A silicoboron carbonitride ceramic stable to 2,000 ° C", Nature vol. 382, pp. 796-798 (Aug. 1996).

Wideman, Thomas, "Synthesis, Characterization, and Ceramic Conversion Reactions of Borazine/Silazane Copolymers: New Polymeric Precursors to SiNCB Ceramics", Chem. Mater. vol. 7, pp. 2203-2212 (1995).

Baldus, Peter et al., "Ceramic Fibers for Matrix Composites in High-Temperature Engine Applications", Sciencevol. 285, pp. 699-703 (Jul. 30, 1999).

Baldus, H.P. et al., "Properties of Amorphous SiBNC-Ceramic Fibres", Key Engineering Materials vols. 127-131 pp. 177-184 (1997).

Linan, An et al., "Development of Injectable Polymer-Derived Ceramics for High Temperature Mems", IEEE Conference on Micro Electro Mechanical Systems (2000).

Freimuth, Herbert et al., "Formation of Complex Ceramic Miniaturized Structures by Pyrolysis of Poly(vinylsilazane)", J. Am. Ceram. Soc. vol. 79(6) pp. 1457-65 (1996).

Kim, Enoch et al., "Two- and Three-Dimensional Crystallization of Polymeric Microspheres by Micromolding in Capillaries", Adv. Mater. vol. 8, No. 3, pp. 245-247 (1996).

St. John, Pamela et al., "Microcontact printing and pattern transfer using trichlorosilanes on oxide substrates", Appl. Phys. Lett. vol. 68(7), pp. 1022-1024 (1996).

Kim, Enoch et al., "Combining Patterned Self-Assembled Monolayers of Alkanethiolates on Gold with Anisotropic Etching of Silicon to Generate Controlled Surface Morphologies", J. Electrochem. Soc. vol. 142, No. 2, pp. 628-633 (1995).

Haverkorn Van Rijsewijk, H.C. et al., "Manufacture of LaserVision video discs by a photopolymerization process", Philips Tech. Rev. vol. 40, No. 10, pp. 287-297 (1982).

Emmelius, Michael et al., "Materials for Optical Data Storage", Angew. Chem. Int. Ed. Engl., vol. 28, No. 11, pp. 1445-1471 (1989).

Lenzmann, F. et al., "Thin-Film Micropatterning Using Polymer Microspheres", Chem. Mater., vol. 6, pp. 156-159 (1994).

Chou, Stephen et al., "Imprint of sub-25 nm vias and trenches in polymers", Appl. Phys. Lett., vol. 67, No. 21, pp. 3114-3116 (1995).

Dushkin, C.D., "Colored Multilayers from Transparent Submicrometer Spheres", Langmuir, vol. 9, pp. 3695-3701 (1993).

Hayashi, Sadao et al., "Imaging by Polystyrene Latex Particles", Journal of Colloid and Interface Science, vol. 144, No. 2, pp. 538-547 (1991).

XIA, Younan et al., "Microcontact Printing of Octadecylsiloxane on the Surface of Silicon Dioxide and Its Application in Microfabrication", J. Am. Chem. Soc., vol. 117, No. 37, pp. 9576-9577 (1995).

Dijksman, J.F., "Analysis of the injection-moulding process", Philips Tech. Rev., vol. 44, No. 7, pp. 212-217 (1989).

Shaw, John E.A., "Capillary fill encapsulation of ISFETs", Sensors and Actuators A, vols. 37-38, pp. 74-76 (1993).

Jacobs, Jeffrey W. et al., "Combinatorial chemistry-applications of light-directed chemical synthesis", Reviews Tibtech, vol. 12, pp. 19-26 (1994).

Sundberg, Steven A. et al., "Spatially-Addressable Immobilization of Macromolecules on Solid Supports", J. Am. Chem. Soc., vol. 117, pp. 12050-12057 (1995).

Gorman, Christopher et al., "Fabrication of Patterned, Electrically Conducting Polypyrrole Using a Self-Assembled Monolayer: A Route to All-Organic Circuits", Chem. Mater., vol. 7, pp. 526-529 (1995).

Kim, Enoch et al., "Polymer microstructures formed by moulding in capillaries", Nature, vol. 376, pp. 581-584 (1995).

Wilbur, James et al., "Microfabrication by Microcontact Printing of Self-Assembled Monolayers", Adv. Mater., vol. 6, No. 7/8, pp. 600-604 (1994).

Kumar, Amit et al., "Patterning Self-Assembled Monolayers: Applications in Materials Science", Langmuir, vol. 10, pp. 1498-1511 (1994).

Pritchard, et al., "Micron-Scale Patterning of Biological Molecules", Communications, Angew. Chem. Int. Ed. Engl., vol. 34, No. 1, pp. 91-93 (1995).

Potochnik, Stephen J. et al., "Selective Copper Chemical Vapor Deposition Using Pd-Activated Organosilane Films", Langmuir, vol. 11, No. 6, pp. 1841-1845 (1995).

Dressick, Walter J. et al., "Patterning of Self-Assembled Films Using Lithographic Exposure Tools", *Jpn. J. Appl. Phys.*, vol. 32, pp. 5829-5839 (1993).

Lazarov, Genady S. et al., "Formation of Two-dimensional Structures from Colloidal Particles on Fluorinated Oil Substrate", *J. Chem. Soc. Faraday Trans.*, vol. 90, No. 14, pp. 2077-2083 (1994).

Nagayama, Kuniaki, "Fabrication of Two-Dimensional Colloidal Arrays", *Phase Transitions*, vol. 45, pp. 185-203 (1993).

Hoyer, Patrick et al., "Small quantum-sized CdS particles assembled to form a regularly nanostructured porous film", *Appl. Phys. Lett.*, vol. 66, No. 20, pp. 2700-2702 (1995).

Bonnemann, Helmut et al., "Preparation and Catalytic Properties of $NR_4^+$-Stabilized Palladium Colloids*", *Applied Organometallic Chemistry*, vol. 8, pp. 361-377 (1994).

Reetz, Manfred T. et al., "Size-Selective Synthesis of Nanostructured Transition metal Clusters", *J. Am. Chem. Soc.*, vol. 116, pp. 7401-7402 (1994).

Reetz, Manfred T. et al., "Visualization of Surfactants on Nanostructured Palladium Clusters by a Combination of STM and High-Resolution TEM", *Science*, vol. 267, pp. 367-369 (1995).

Meldrum, Fiona C. et al., "Formation of Thin Films of Platinum, Palladium and Mixed Platinum: Palladium Nanocrystallites by the Langmuir Monolayer Technique", *Chem. Mater.*, vol. 7, pp. 1112-1116 (1995).

Vargo, Terrence G. et al., "Adhesive Electroless Metallization of Fluoropolymeric Substrates", *Science*, vol. 262, pp. 1711-1712 (1993).

Calvert, Jeffrey M. et al., "Deep ultraviolet patterning of monolayer films for high resolution lithography", *J. Vac. Sci. Technol. B*, vol. 9, No. 6, pp. 3447-3450 (1991).

Li, Jian et al., "Copper-Based Metallization for ULSI Applications", *MRS Bulletin*, pp. 18-21 (Jun. 1993).

Cho, James S.H. et al., "Electroless Cu for VLSI", *MRS Bulletin*, pp. 31-38 (Jun. 1993).

Van Der Putten, Andre M.T. et al., "Electrochemistry of Colloidal Palladium", *J. Electrochem. Soc.*, vol. 139, No. 12, pp. 3475-3480 (1992).

Ting. Chiu H. et al., "Selective Electroless Metal Deposition for Integrated Circuit Fabrication", *J. Electrochem. Soc.*, vol. 136, No. 2, pp. 456-462 (1989).

Jackson, Robert L., "$Pd^{+2}$/Poly(acrylic acid) Thin Films as Catalysts for Electroless Copper Deposition: Mechanism of Catalyst Formation", *J. Electrochem. Soc.*, vol. 137, No. 1, pp. 95-101 (1990).

Van Der Putten, Andre M.T., "Anisotropic Deposition of Electroless Nickel", *J. Electrochem. Soc.*, vol. 140, No. 8, pp. 2229-2235 (1993).

Van Der Putten, Andre M.T., "Controlled Mechanical Adhesion of Electroless Cu Patterns", *J. Electrochem. Soc.*, vol. 140, No. 8, pp. 2376-2377 (1993).

Jackson, Robert L., "Initiation of Electroless Copper Plating Using $Pd^{+2}$/Poly(acrylic acid) Films", *J. Electrochem. Soc.*, pp. 3172-3173 (1988).

Mak, Celia Y., "Electroless Copper Deposition on Metals and Metal Silicides", *MRS Bulletin*, pp. 55-62 (Aug. 1994).

Dressick, Walter J. et al., "Photopatterning and Selective Electroless Metallization of Surface-Attached Ligands", *Chem. Mater.*, vol. 5, pp. 148-150 (1993).

Nakahara, S., "Microstructure and Mechanical Properties of Electroless Copper Deposits", *Annu. Rev. Mater. Sci.*, vol. 21, pp. 93-129 (1991).

Jeon, Noo Li et al., "Patterned Self-Assembled Monolayers Formed by Microcontact Printing Direct Selective Metalization by Chemical Vapor Deposition on Planar and Nonplanar Substrates", *Langmuir*, vol. 11, pp. 3024-3026 (1995).

Dubin, Valery M., "Electroless Ni-P Deposition on Silicon with Pd Activation", *J. Electrochem. Soc.*, vol. 139, No. 5, pp. 1289-1294 (1992).

Buam and Borman, C&EN, Special Report, "Combinatorial chemists focus on small molecules, molecular recognition, and automation", pp. 28-54, Feb. 12, 1996.

Thayer, Ann, C&EN, Special Report, "Combinatorial chemistry becoming core technology at drug discovery companies", pp. 57-64 (1996).

Krieger, James, C&EN, Special Report, "Combinatorial chemistry spawns new software systems to manage flood of information", pp. 67-73, Feb. 12, 1996.

\* cited by examiner

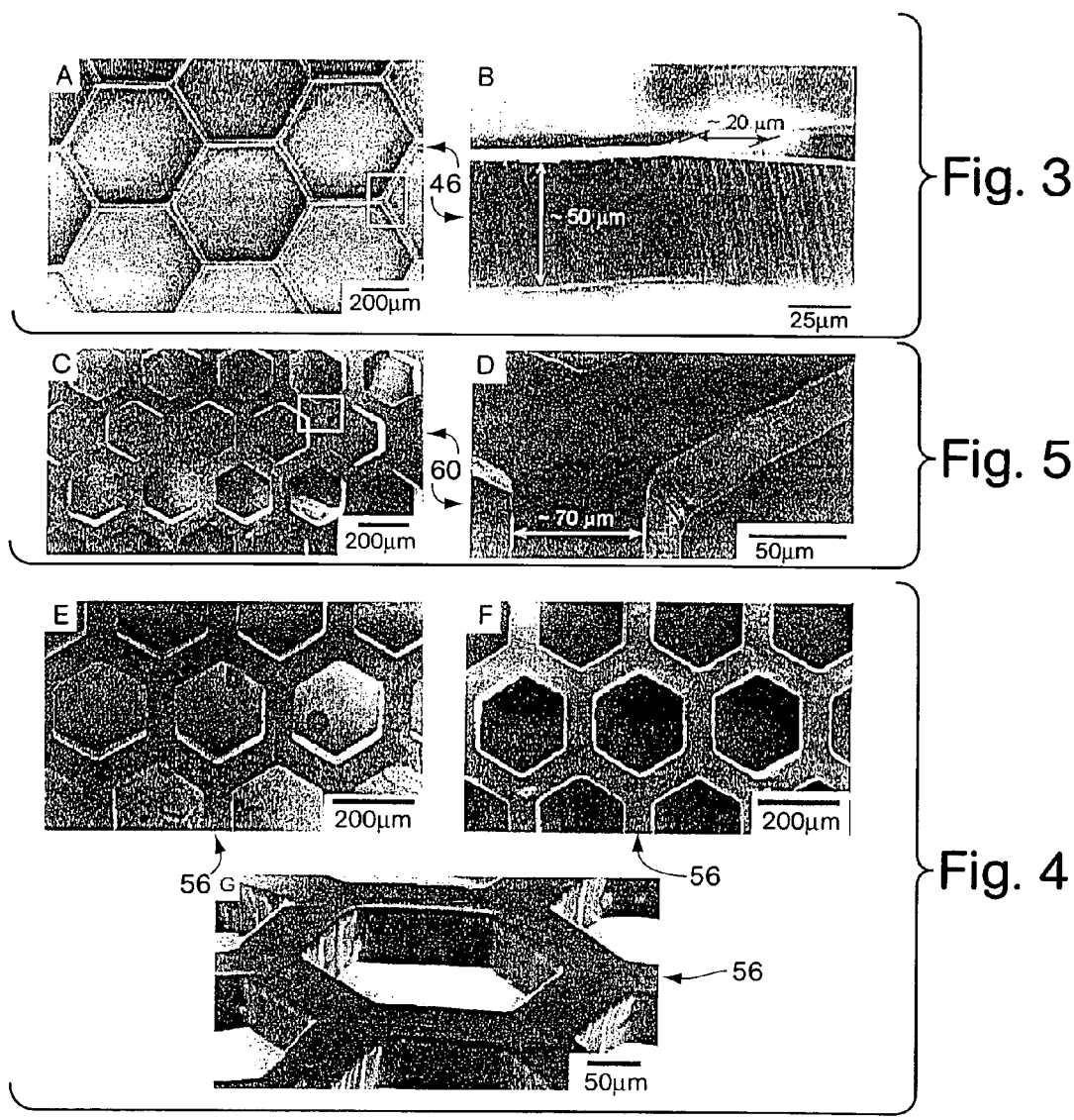

FABRICATION OF CERAMIC MICROSTRUCTURES

RELATED APPLICATIONS

This application claims priority to U.S. Provisional Patent Application Ser. No. 60/233,156, filed Sep. 18, 2000.

FIELD OF THE INVENTION

The present invention relates generally to ceramic solid articles, and more particularly to a method for making these articles on the micron scale by molding them from ceramic precursors.

This invention was sponsored by the Space and Naval Warfare Systems Grant No. N66001-98-1-8915. The government has certain rights in the invention.

BACKGROUND OF THE INVENTION

In the fields of chemistry, biology, materials science, microelectronics, optics, and medicine the development of devices which are small relative to the state of the art and which are conveniently and relatively inexpensively produced is important.

A well-known method of production of devices, especially in the area of microelectronics, is photolithography. According to this technique, a negative or positive resist (photoresist) is coated onto an exposed surface of an article. The resist then is irradiated in a predetermined pattern, and portions of the resist that are irradiated (positive resist) or nonirradiated (negative resist) are removed from the surface to produce a predetermined pattern of resist on the surface. This is followed by one or more procedures. According to one, the resist serves as a mask in an etching process in which areas of the material not covered by the resist are chemically removed, followed by removal of resist to expose a predetermined pattern of a conducting, insulating, or semiconducting material. According to another, the patterned surface is exposed to a plating medium or to metal deposition (for example under vacuum) followed by removal of resist, resulting in a predetermined plated pattern on the surface of the material. In addition to photolithography, x-ray and electron-beam lithography can be used in an analogous fashion. Lithography techniques such as those mentioned above typically require relatively expensive apparatus, and are relatively labor intensive. The techniques require the design and fabrication of chrome masks, access to clean rooms, and other requirements commonly known to those skilled in the art.

Microelectromechanical systems are an area of relatively intensive research. These systems involve the fabrication of microscale structures prepared from silicon, or occasionally from other material such as gallium arsenide, silicon carbide, silicon nitride, metals, glasses, or plastics, by typical integrated circuit industry microfabrication techniques such as photolithography or additive/subtractive processes such as deposition and etching. While interesting systems have been developed, simplification and increased versatility would be advantageous.

Ceramic structures such as borosilicon carbonitride have numerous applications. Ceramics have found extensive use in connection with products to be used in harsh operating conditions such as when exposed to high temperatures, highly oxidative environments, and when exposed to aggressive chemical conditions. Ceramics are also known for their high strength, hardness, low thermal conductivity, and low electrical conductivity.

U.S. Pat. No. 5,698,485 (Brück) describes a process for producing ceramic microstructures from mold inserts structured by using the technique lithographic, galvanoformung, abformung (LIGA), a lithographic structuring method requiring the use of high energy radiation. LIGA requires a high energy radiation sources such as UV radiation, X-rays, or ion beams. Brück also describes structuring simple geometrically shaped PTFE, PC or PMMA mold inserts through machining.

PCT international application number PCT/US98/02573 (Schueller) describes the fabrication of carbon microstructures.

*Mat. Res. Innovat.* 1999,2,200 (Jungermann, et al.) describes the synthesis of amorphous $Si_2B_2N_5C_4$. *Nature* 1996, 382, 796 (Riedel, et al.) discloses the synthesis of amorphous silicoboron carbonitride stable up to 2000° C.

These and other techniques for the use of ceramics, including the production of small-scale devices, are useful in some circumstances. However, these techniques typically involve more than a desirable number of fabrication steps, and in many cases it would be advantageous to reduce the cost, and increase versatility, associated with these techniques. Additionally, micromachining is an expensive technique requiring specialty equipment.

Accordingly, it is an object of the invention to provide a technique for forming ceramic solid structures on the micron scale conveniently, inexpensively, and reproducibly.

SUMMARY OF THE INVENTION

The present invention provides techniques for forming ceramic solid structures. In one aspect, the invention provides a method which involves filling an elastomeric mold with a precursor of the ceramic solid structure. The ceramic precursor, in one embodiment, is characterized as a viscous fluid where the viscosity can be attained by setting the precursor and allowing it to maintain its shape. The method can also involve removing the mold from a product of the ceramic precursor. In one embodiment the mold is removed by physically separating the mold from the ceramic precursor. In an alternate embodiment the mold is removed by dissolving the mold. In yet another embodiment, the mold is treated to aid removal of the mold from the ceramic precursor. In a further embodiment, treatment can involve silanizing a surface of the mold. The filling step comprises, according to one embodiment, filling the ceramic precursor between the surface of the mold and a substrate. The mold then is removed from the product of the ceramic precursor and the ceramic precursor remains on the substrate. In a further embodiment, the ceramic precursor is removed from the substrate and a freestanding ceramic solid structure is formed. The free-standing structure is rigid enough to maintain its shape without support along all surfaces of the structure. For example, a small portion of the structure can be held with a support such as a clamp or sharp tweezers.

In another embodiment, the invention provides a method that includes filling the mold with the precursor of the ceramic solid structure, and setting the ceramic precursor. A solid structure, in a shape of the mold, is thereby formed. This method can be carried out using the technique described above, namely, forming the solid structure against the surface of the mold, and can involve other described steps. In one embodiment, the ceramic precursor is set thermally. In another embodiment, the ceramic precursor is set by curing chemically.

In a further embodiment, a method of the invention involves filling, simultaneously, at least two ceramic solid structures from ceramic precursors of the structures. This can involve forming the ceramic precursors against at least two indentations in a surface of a mold, and allowing the ceramic precursors to solidify against the at least two indentations. The precursors then can be heated to form the at least two ceramic solid structures.

In the above methods, one or more ceramic precursors can be placed against one or more surfaces of the mold (or one or more indentations in a surface that define two or more molds), setting the ceramic precursor, removing the mold, and thermally setting by heating the precursor to form the ceramic solid structure. The method can involve heating the ceramic precursor to form the ceramic solid structure having a dimension of less than 100 µm.

In another embodiment, a method of the invention involves applying the ceramic precursor of the ceramic solid structure to an indentation pattern in the surface of an elastomeric mold, applying the elastomeric mold to a surface of a substrate to encapsulate the ceramic precursor between the substrate surface and the indentation pattern, and curing the ceramic precursor. Then, the mold is removed from the substrate and from the ceramic precursor. The ceramic precursor then is heated to form a free-standing ceramic solid structure having a dimension of less than 100 µm.

According to another aspect, articles are provided in accordance with the invention. In one embodiment, the invention provides a free-standing, ceramic solid structure having a dimension of less than 100 µm. In another embodiment, the dimension is less than 50 µm, and in yet another embodiment less than 25 µm. In other embodiments the structure has a dimension of less than 15 µm, less than 10 µm, less than 5 µm, or less than 1 µm.

The invention provides, according to another embodiment, an article comprising a hexagonal grid.

According to another aspect, a microgear is provided in accordance with the invention.

In yet another aspect, the invention provides a method that involves forming a ceramic solid structure that is a replica of a template structure. The method involves forming the ceramic precursor of the ceramic structure against the surface of a mold cast from the template, and allowing the precursor to take the form characterized by the mold.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure.

BRIEF DESCRIPTION OF THE DRAWINGS

FIG. 3 is a photocopy of a scanning electron micrograph (SEM) image of a free-standing ceramic structure;

FIG. 4 is a photocopy of a SEM image of a free-standing, ceramic structure;

FIG. 5 is a photocopy of a SEM image of a free-standing, ceramic structure; and

DETAILED DESCRIPTION OF THE INVENTION

Figure 1A:
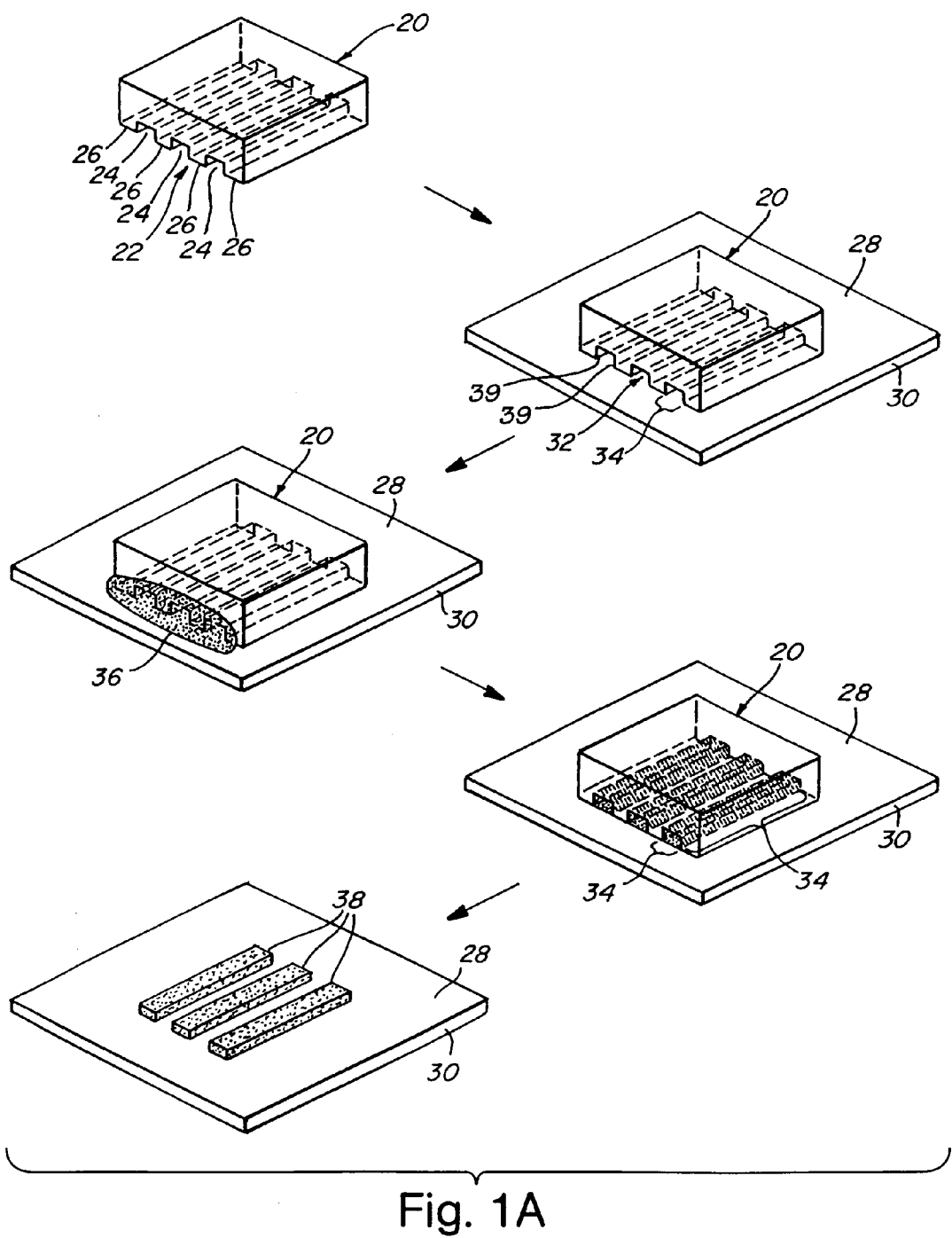
FIG. 1A illustrates schematically a technique for forming a ceramic solid structure against a surface using a mold, from a ceramic precursor.

The present invention provides techniques for forming ceramic solid structures from ceramic precursors of these structures, using elastomeric molds, and structures produced according to the techniques. A variety of structures useful in microanalytical, microelectronic, micromechanical, chemical, medical and biomedical fields can be produced according to the techniques. Furthermore, the present invention provides techniques for easily reproducing intricate microscale ceramic solid structures consistently.

The ceramic solid structures of the invention, for example borosilicon carbonitride, can be used in applications where light weight, high chemical resistance, high oxidative resistance, and/or high temperature thermal stability are required properties. There are a small number of materials such as silicon carbide, silicon nitride, and metal alloys which can maintain their mechanical strengths at high temperatures, typically exceeding 1300° C. Silicon carbide (SiC) and silicon nitride ($Si_3N_4$) are the most commonly explored materials for high temperature mechanical applications. However, silicon carbide, silicon nitride, and metal alloys suffer several drawbacks at high temperatures. Silicon carbide and silicon nitride are difficult to fabricate, undergo phase transformations, and degrade mechanically at temperatures above 1400° C. Metal alloys, such as nickel aluminum-based materials, used for high temperature mechanical applications are also not effective at high temperatures. Metal alloys usually fail structurally or melt at temperatures above 1395° C.

On the other hand, ceramics, such as borosilicon carbonitride, can maintain their structural integrity at temperatures exceeding 2000° C. in an inert atmosphere. In air, ceramics have excellent oxidative stability and are able to withstand temperatures greater than 1050° C. for longer than two hours. It has also been shown that ceramics can sustain their oxidative stability in air at temperatures up to 1500° C. Even under these extreme conditions, ceramics maintain their density. For example, borosilicon carbonitride, maintains its low density of approximately 1.8 grams per cubic centimeter at high temperatures. In addition, when ceramics are exposed to harsh environments, they are able to maintain their structural integrity. One indicator of a ceramic's ability to maintain its structural integrity is its Young's modulus. The Young's modulus is a measure of strain, expressed by the ratio of a stress on a given unit of a substance to an accompanying distortion. It is a feature of the invention that the Young's modulus does not change significantly when a ceramic solid structure of the invention is exposed to harsh environments.

Another test to determine the oxidative stability of a ceramic solid structure is to expose the ceramic solid structure to an oxidative environment at high temperature. The ceramic article is then cooled down to 25° C. Next, a scanning electron micrograph (SEM) is taken of the ceramic solid structure. The absence of structural defects appearing on the ceramic solid structure as seen on the SEM image is a good indication of the thermal and oxidative structural integrity of the ceramic solid structure.

The invention utilizes an elastomeric mold comprising an indentation pattern that can be used to transfer a ceramic precursor of a ceramic structure from the mold to a substrate surface or that can serve as a mold that when, positioned proximate to a surface of the substrate, can define a region in which the ceramic precursor is positioned. As used herein, "elastomer" describes a compound which exhibits rubbery properties. In other words, an elastomeric compound will recover most of its original dimensions after extension or compression.

The substrate can be any surface known in the art and can even be another mold.

In one embodiment, the ceramic precursor is comprised of three or more different atom types and preferably at least four different atom types such that a quaternary ceramic results. An illustrative example of atoms types which can be found in the ceramic precursor are: carbon, nitrogen, boron, silicon, phosphorus, aluminum, and/or hydrogen. The ceramic precursor can be monomeric, oligomeric or polymeric.

Figure 1B:
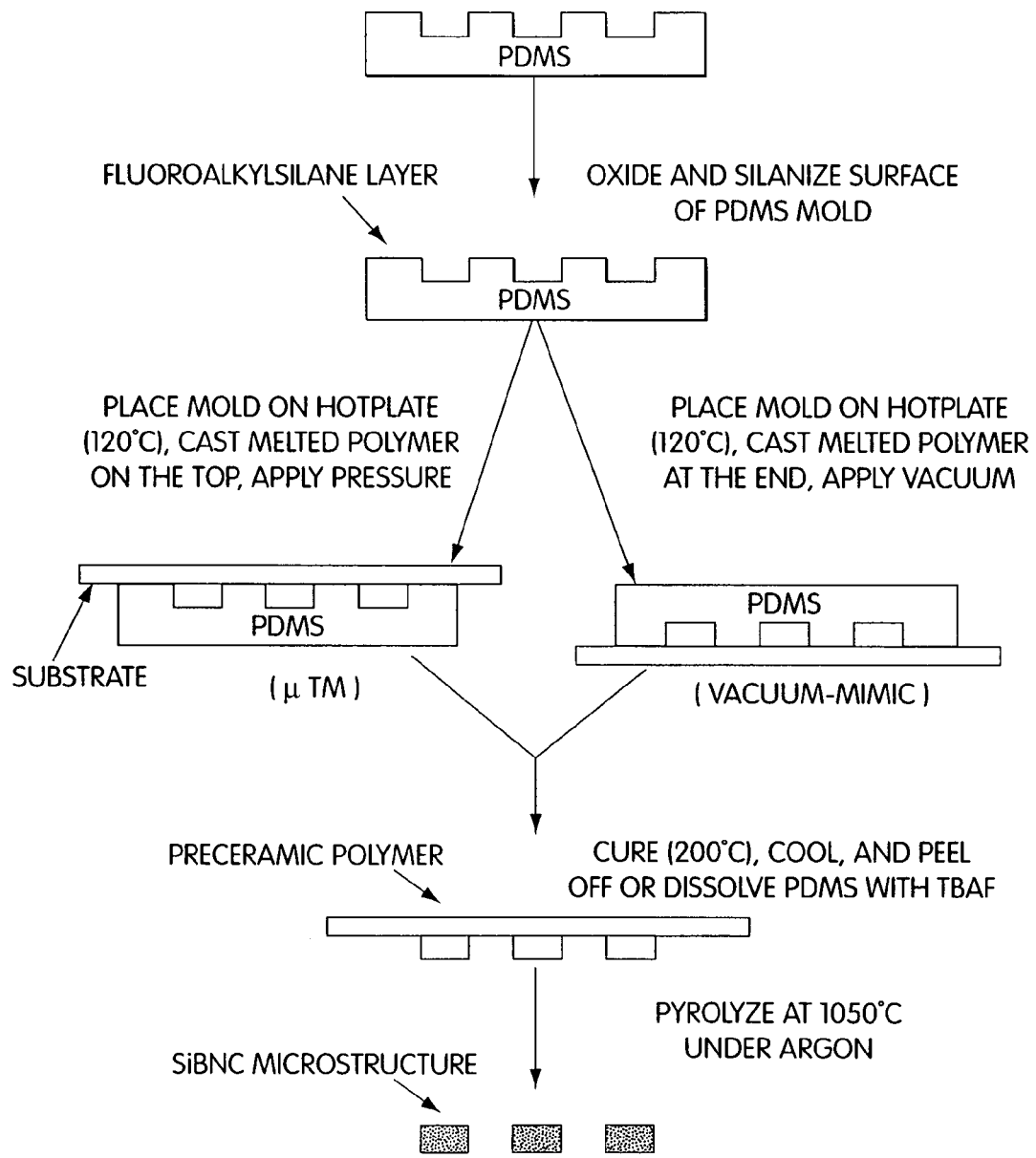
FIG. 1B shows another scheme for forming a ceramic solid structure against a surface using a mold, from a ceramic precursor.

FIG. 1 illustrates schematically a technique for forming the ceramic structure at the substrate surface. An article 20, which serves generally as the elastomeric mold, includes an application surface 22 including a plurality of indentations 24 that together define a linear, patterned array of indentations contiguous with a contact surface 26. In one embodiment, after forming article 20, article 20 is treated, for example by silanization with an agent that is not reactive with the ceramic precursor. This allows removal of the mold from a resulting solid without causing destruction of the solid. For example silanization prevents the ceramic structure 38 from adhering to article 20. This treatment can be accomplished with a variety of agents, such as alkylating, silylating, fluoroalkylating, or alkylsilylating agents. Article 20, according to one embodiment, is a mold or an applicator used to transfer the precursor of the ceramic structure, in a linear pattern, to a region or regions proximate the substrate surface. Article 20 also can define a forming article or micromold placed proximate the substrate surface and used to guide the ceramic precursor of the ceramic structure so as to position the ceramic precursor in a pattern at a predetermined region or regions proximate the substrate surface. As used herein, the term "proximate" is meant to define at the substrate surface, that is, in contact with the substrate surface, or at a position near the substrate surface and fixed relative to the substrate surface.

When article 20 is placed proximate a surface 28 of a substrate 30, contact surface 26 of the article seals portions of the surface 28 that it contacts, thereby forming channels 32 defined by indentations 24 and portions 34 of the substrate surface 28 not contacted by the contact surface 26. In this manner a micromold is created, which is defined by the article 20 and the substrate surface 28. A ceramic precursor 36 of a ceramic structure is placed adjacent one or more openings of the channels 32 and introduced into the channels 32 and allowed to flow adjacent portions 34 of the substrate surface 28 in register with the indentations 24. The ceramic precursor 36 can be urged to flow via, for example, pressure applied to the ceramic precursor as it is positioned so as to enter the channels, or vacuum created within the channels by, for example, connection of the outlets of the channels to a source of vacuum. Alternatively, according to one aspect of the invention, the ceramic precursor can be allowed to flow into the mold via capillary action. Capillary filling of the mold is especially useful when the mold is of very small dimension (in particular in the micro scale) and is defined herein to mean that when a ceramic precursor is positioned adjacent an opening or the channel 32 formed by a portion 34 of the substrate surface and the indentation 24 of article 20, the ceramic precursor will flow into at least a portion of the channel spontaneously. In alternate embodiments, the filling step is performed under an inert atmosphere and/or moisture-free atmosphere. As used herein, "inert" means almost entirely or entirely unreactive. In addition, as used herein "moisture free" means an environment which has less than 0.1% water or even up to less than 1% water.

Subsequent to introduction of the ceramic precursor 36 into channel 32, the ceramic precursor 36 can be solidified, or cured, before removal of article 20 from the substrate surface 28. The curing step is generally carried out to partially or fully cross-link the ceramic precursor, or polymerize a precursor that can include monomeric or oligomeric species. In one embodiment, the thermal setting or curing temperature is greater than 100° C. In another embodiment, the ceramic precursor is cured chemically. When cured chemically, the curing step can be performed under an inert atmosphere and/or under a moisture free environment.

The article 20 can be removed by peeling article 20 off of the cured ceramic precursor 36. In an alternate embodiment, article 20 is removed from the cured ceramic precursor 36 by dissolving article 20. In a further embodiment, article 20 is dissolved using a solution containing a fluoride anion provided by compounds such as tetrabutylammonium fluoride. The cured ceramic precursor 36 can then be heated usually at a temperature greater than the thermal curing temperature. In an alternate embodiment, the cured ceramic precursor 36 can by heated without removing the article 20. It is during the heating step that two changes can occur to the cured ceramic precursor. First, the ceramic precursor undergoes a polymerization reaction. Second, the ceramic precursor will be pyrolyzed. As used herein, "pyrolyzation" means treatment of a ceramic precursor to reaction conditions, such as high temperature. Under these reaction conditions, a material which undergoes pyrolysis may have any one or a combination of any of solvent, gases, heteroatoms, and/or functional groups removed. In addition, ceramics which undergo pyrolysis may undergo a reorganization of the atomic matrix. After heating, the article 20 is removed from the heated ceramic precursor 36.

The pattern of parallel indentations 24 formed in the surface 22 of the article 20 is for illustrative purposes only. Any pattern, for example a pattern defined by a single indentation or many indentations, one or more of the indentations defining a non-linear pathway of uniform or non-uniform depth, is intended to fall within the scope of the invention. Various patterns are illustrated in subsequent figures. The indentation pattern can be of a variety of dimensions and, according to one aspect of the invention, includes a region having a dimension of less than 100 µm. The dimension can be a lateral dimension or vertical dimension. "Lateral dimension" is meant to define a dimension parallel to application surface 22. "Vertical dimension" is meant to define a dimension perpendicular to the surface. A lateral or vertical dimension can be a dimension of a feature that is a portion of an overall structure. That is, an overall structure could have a width of 5 millimeters parallel to the surface and a height of 5 millimeters relative to the surface, but include a ridge on the top of the structure of 75 µm height and 75 µm width. That sub-feature would, by definition, have a lateral dimension of 75 µm and a vertical dimension of 75 µm. According to preferred embodiments, the indentation pattern includes a portion having a dimension of less than about 100 µm, less than about 50 µm, less than about 30 µm, less than about 20, 15, 10, 5 or 1 µm. The dimension of the indentations can be altered by deforming the article 20.

Where the article 20 is placed adjacent to the substrate surface 28 and the ceramic precursor fills channels 32, ceramic structure or structures 38 resulting from the technique can have lateral dimensional features that correspond to the lateral dimensional features of indentations 32 of the article. For some structures, it is not necessary that the ceramic precursor completely fill the channels 32 and some minute flaws may be tolerated. In other embodiments in which channels 32 may not be completely filled, the lateral dimension of ceramic article 38 formed from the ceramic precursor is to be minimized. According to this embodiment, ceramic precursor 36 is introduced into the channels 32 in an amount small enough that the ceramic precursor wets only the corners of the channels. When the ceramic precursor, substrate, and article are selected such that the ceramic precursor will wet the micromold efficiently via capillary action, when a small amount of ceramic precursor is supplied to the article channel or channels, the ceramic precursor will selectively wet portions of the channels having a low interior angle relative to the rest of the channel (such as corners 39 defined by the abutment of contact surface 26 against the substrate surface 28 at the edge of region 34 of the substrate surface). When the ceramic precursor wets the corners selectively and the ceramic precursor is heated to form the ceramic structure, the resulting structure can define a pattern having a dimension smaller than that of the lateral dimension of indentation 24. According to this embodiment the lateral dimension of structure 38, at its narrowest, is narrower than the narrowest lateral dimension of channel 24 of the article, and can have a height significantly less than the height of the channel. The lateral dimension of the ceramic structure 38 according to this embodiment can be on the order of less than or equal to about 100 µm or 50 µm, or preferably less than about 20 or 10 µm, more preferably less than about 5 µm or 1 µm.

Any suitable material can define the substrate 30 of the invention. The substrate surface 28 can be of the same material as the bulk material of substrate 30, or a different material. Substrates exposing a variety of functional surfaces such as hydrophobic, hydrophilic, and biologically compatible or non-compatible surfaces are known, and are suitable for use with the invention. In other embodiments, free-standing ceramic structures are formed. In particular, a silicon wafer carrying a fluorosilane film is particularly useful. Other substrate materials include silicon, silicon dioxide, silicon nitride, polymers and metals such as gold and chromium. In a further embodiment, the substrate is treated so that it is inert. Article 20 similarly can be formed of a variety of materials. According to one embodiment, substrate surface 28 and/or contact surface 26 of article 20 is an elastomer or other conformable material. Preferably, contact surface 26 and more preferably, for ease of fabrication, the entire article 20, is formed of an elastomer, most preferably polydimethyl siloxane (PDMS). When the elastomer defines substrate surface 28 or contact surface 26, or preferably article 20, an optimal seal is created between contact surface 26 and portions of the substrate surface 28 adjacent and contiguous with portions 34 that with the indentations 24 define the channels 32. This results in optimal confinement of the ceramic precursor 36 to the channels 32. According to the invention pressure can be applied to the article 20 against the substrate 30 during micromolding, but according to embodiments in which an elastomer is used as described, pressure need not be applied as the elastomer conforms well to the surface against which it mates thus sealing the channels 32. The article 20 can be fabricated of an elastomer in a manner analogous to the fabrication of a stamp from an elastomer as described in co-pending, commonly-owned U.S. application Ser. No. 08/131,841 by Kumar, et al, entitled "Formation of Microstamped Patterns on Surfaces and Derivative Articles", filed Oct. 4, 1993, and incorporated herein by reference.

Figure 2:
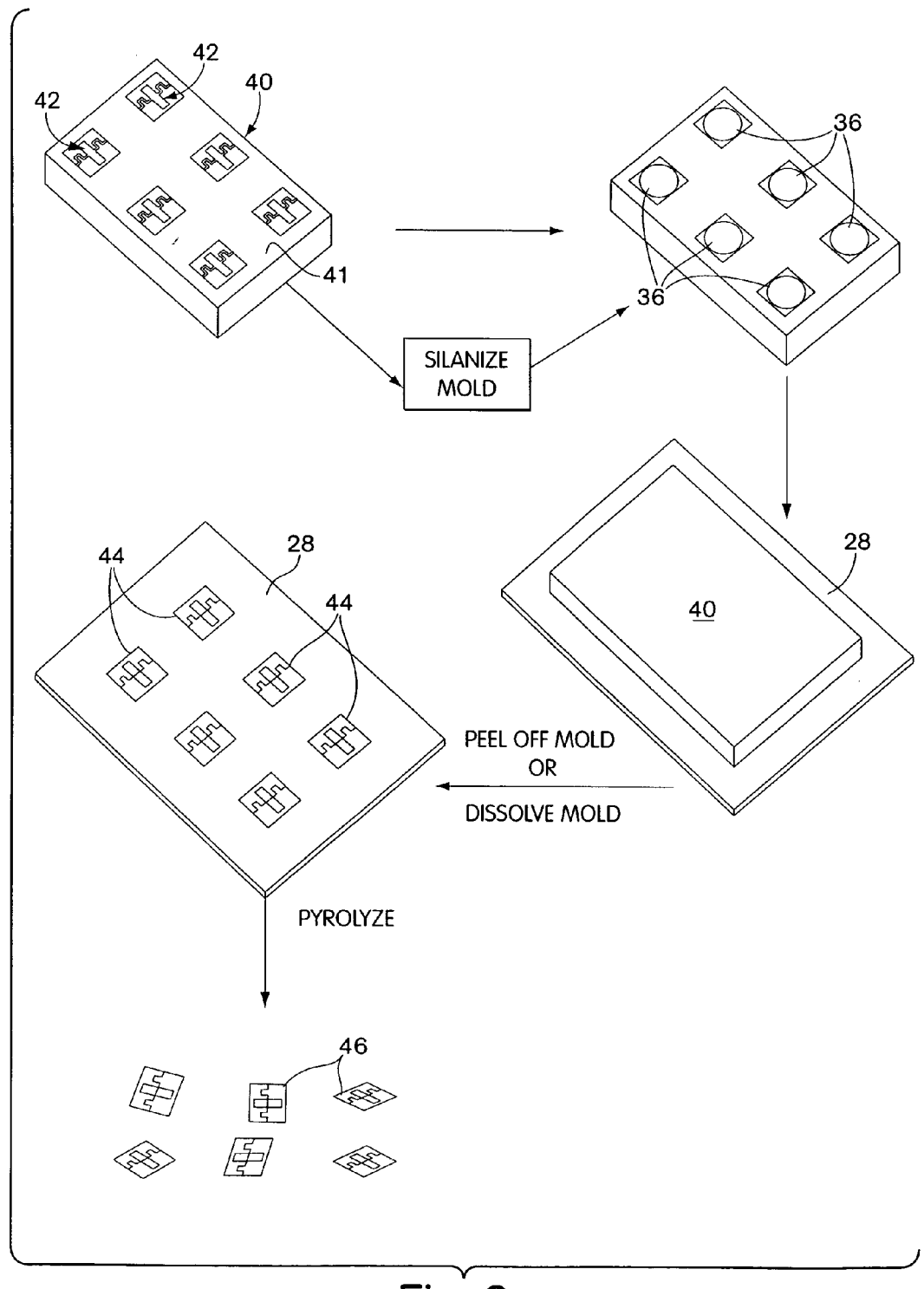
FIG. 2 is a schematic illustration of a technique for transferring a ceramic precursor of a ceramic solid structure from indentations in a mold to a substrate surface, forming ceramic solid structures at the surface, and removing free-standing articles from the surface.

FIG. 2 illustrates another embodiment of the invention in which, rather than forming ceramic structures via micromolding, a microtransfer molding technique is used to transfer a set of patterns, in parallel, to a substrate surface 28 (parallel molding of a variety of similar patterns via micromolding as illustrated in FIG. 1 is embraced by the invention as well). In FIG. 2 a transfer article 40, which can be made of the same material from which article 20 is made, includes a plurality of indentation patterns 42 that can be identical. Application of the ceramic precursor 36 to the plurality of indentation patterns 42, followed by positioning the indentation patterns of the applicator adjacent the substrate surface 28, results in transfer of the ceramic precursor, in the pattern, to the substrate surface 28. Heating can take place prior to or after removal of the article 40 from the substrate surface 28, preferably after removal of the article following brief, mild heating. Specifically, ceramic precursor 36 is applied to the indentation patterns 42 preferably by coating the surface 41 with ceramic precursor 36, spreading the ceramic precursor back and forth across the surface 41 with an applicator to assure filling of each of the indentations 42, and removal of excess ceramic precursor until a small drop of the ceramic precursor is left essentially in the center of the indentation pattern. Then, the surface 41 of the applicator is brought into contact with the substrate surface 28 to transfer the ceramic precursor, in the pattern, to the substrate surface 28. At this point, the substrate and applicator are, together, gently thermally cured to, for example, 150° C. by gradually raising the temperature for one hour, and then the applicator 40 removed, leaving a plurality of pre-heated ceramic precursors 44, arranged in patterns corresponding to the indentation patterns 42 of applicator 40, on the substrate surface 28. Following heating under an inert atmosphere, ceramic microstructures 46 can be allowed to remain on the substrate surface 28, or can be removed from the substrate surface 28 to define free-standing articles.

According to the embodiment illustrated in FIG. 2, the ceramic precursor 36 of the ceramic articles 46 is transferred essentially instantaneously to the substrate surface 28, in the indentation pattern 42.

As used herein, "ceramic solid structure" includes a class of materials comprising inorganic, nonmetallic solids which can withstand high temperatures during manufacture and use. An example of a ceramic solid structure would be borosilicon carbonitride (SiBNC).

Borosilicon carbonitride (SiBNC) can be synthesized from several preceramic polymers. Borosilicon carbonitride ceramics have several beneficial characteristics which make them useful for applications under high temperature conditions. Borosilicon carbonitride materials are light weight and stable at temperatures exceeding 2000° C. in an inert atmosphere. They also show excellent resistance to oxidation at temperatures up to 1500° C. in air.

In one embodiment, the ceramic article demonstrates structural integrity when exposed to harsh oxidative and thermal conditions. In another embodiment of the invention, the ceramic article is structurally stable when exposed to harsh oxidative and thermal conditions as demonstrated by an SEM analysis of the ceramic article. In a further embodiment, the ceramic article demonstrates its structural integrity upon being exposed to air for two hours at 1050° C. as demonstrated by SEM analysis of the ceramic article.

In a preferred embodiment, the ceramic article's Young's modulus will not change more than 10% upon heating to 1400° C. in an inert atmosphere. In another preferred embodiment, the ceramic article's Young's modulus will not change more than 10% upon heating to 1400° C. in air. In a further preferred embodiment, the Young's modulus at 25° C. will not change by more than 10% upon heating the ceramic article to 1400° C. followed by cooling the ceramic article down to 25° C.

A simple screening test for determining useful precursors of ceramic materials of the invention involves providing a known precursor and testing its viscosity to determine whether it can fill a mold having dimensions on the order of dimensions desired in a final ceramic structure. If the material is too viscous, it can be determined whether viscosity can be lowered by dilution with a suitable solvent, preferably a low-boiling solvent that can be driven off via gentle heating prior to pyrolyzation and condensation. In another embodiment, viscosity of the ceramic precursor is controlled by a reaction with ammonia. In an alternate embodiment, a ceramic precursor viscosity of less than 500 $cm^2/s$ is sufficient.

FIG. 3 is a photocopy of two SEM images of the same free-standing, ceramic solid structure 46, fabricated in accordance with the technique of FIG. 1. By use of the term "free-standing", it is meant that the structure need not be supported by a substrate, and is not an integral part of a substrate. The structure has a variety of different feature sizes. Structure 46 is a hexagonal grid with a vertical dimension of approximately 50 μm and a lateral dimension of approximately 20 μm.

FIG. 4 is a photocopy of three SEM images of the same free-standing, ceramic solid structure 66. However, the ceramic structure of FIG. 4 has been heated in air to 1050° C. for two hours. FIG. 4 demonstrates the high oxidative stability of ceramics at high temperatures as no obvious oxidative defects are seen in the SEM images.

FIG. 5 is a photocopy of two SEM image of another free-standing, ceramic solid structure 66. Structure 66 is a hexagonal grid with a lateral dimension of approximately 70 μm.

Figure 6A:
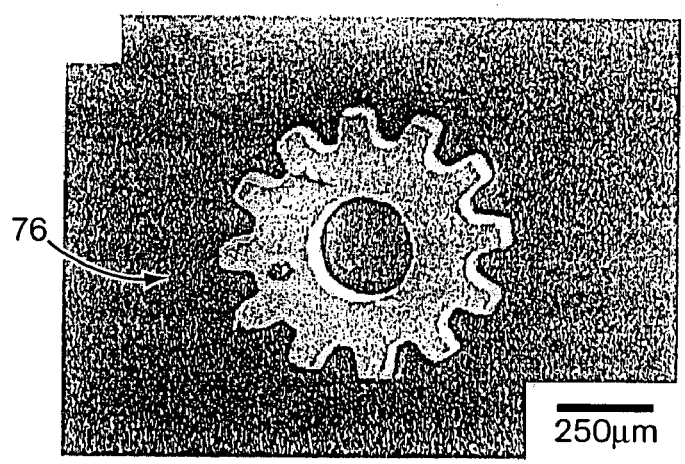
FIG. 6 is a photocopy of three SEM image of a free-standing, ceramic solid structure, the structure being a micron scale tooth of a gear with an aspect ratio of approximately 3–4 to 1.
Figure 6B:
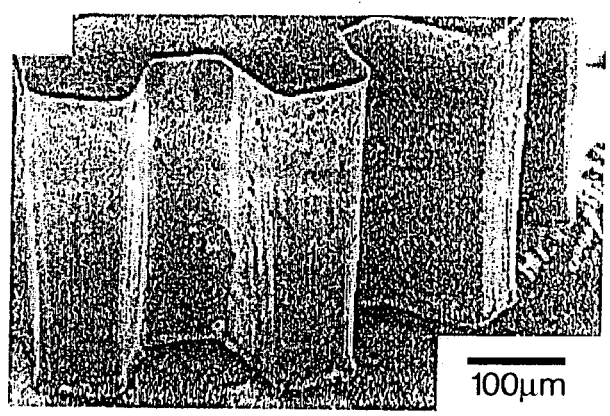
Figure 6C:
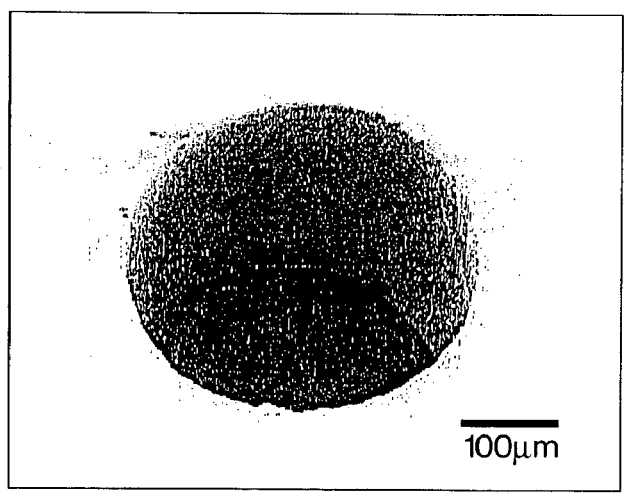

FIG. 6 is a photocopy of three SEM image of the same free-standing, ceramic solid structure 76. Structure 76 is a micron scale tooth of a gear with an aspect ratio of approximately 3–4 to 1.

The technique of the invention can be carried out on nonplanar, for example, curved surfaces when a flexible or elastomeric applicator (20/40) is used. Where a nonplanar substrate 28 exists, a flexible or elastomeric applicator 20 or 40 can be bent to conform to the nonplanar substrate surface 28 and the technique carried out as described. Where the ceramic precursor 36 of a ceramic solid structure is viscous enough, the nonplanar substrate, such a cylindrical article (capillary or the like) can be rolled across the surface 41 or 22 of applicator 40 or 20, respectively, the pattern transferred to the nonplanar article, and the ceramic structure heated on the surface of the article.

Example ceramics that can be made in accordance with the invention include SiCN, SiC, SiN, BN and SiAlCN.

The function and advantage of these and other embodiments of the present invention will be more fully understood from the examples below. The following examples are intended to illustrate the benefits of the present invention, but do not exemplify the full scope of the invention.

EXAMPLE 1

Fabrication of Ceramic Structure Molds

The photomasks used for the fabrication of masters were transparency films having opaque patterns of features printed by a high-resolution printer ($\geq$3386 dpi). The masters were fabricated using SU-8 photoresist (MicroChem Corp., Newton, Mass.) on silicon wafers (Test grade, Silicon Sense, Inc., Nashua, N.H.) by conventional photolithographic techniques. The bas-relief masters of SU-8 were silanized in a dessicator that was connected to a vacuum, and contained a vial with small amount of (tridecafluoro-1,1,2, 2-tetrahydrooctyl)-1-trichlorosilane. The silanization was used to prevent adhesion of PDMS to the masters. Casting prepolymer, Sylgard 184 (Dow Corning, Midland) on these silanized masters and curing at 70° C. formed the PDMS molds with bas-relief structures as negative replicas of the structures in the SU-8. The PDMS molds were heated at 160° C. in an oven for ~2 h to complete the cure. The surface of the PDMS mold was oxidized with an oxygen or air plasma in a plasma cleaner (SPI Plasma PREP II™; www.2spi.com) at a pressure of ~1 mm Hg for 2 min. These molds were then exposed to vapors of (tridecafluoro-1,1,2, 2-tetrahydrooctyl)-1-trichlorosilane for ~12 h to obtain hydrophobic surfaces. Polished silicon wafers were used as substrates and treated with oxygen plasma and silanized by the aforementioned reagent prior to use.

EXAMPLE 2

Synthesis of Polymeric Ceramic Precursor

All syntheses were performed under an argon atmosphere in Schlenk-type glassware. The polymeric precursor was synthesized from 1-(trichlorosilyl)-1-(dichloroboryl)ethane (TSDE). The duration of the polymerization was adjusted under an ammonia atmosphere in order to obtain a preceramic polymer with a suitable viscosity for microtransfer molding (μTM) and vacuum assisted micromolding in capillaries (MIMIC) at temperatures of 120–140° C. The product was a colorless transparent glass-like solid at room temperature. At 120° C., the preceramic polymer has a viscosity similar to that of thick honey.

EXAMPLE 3

Synthesis of 1-(Triclororosilyl)-1-(dichloroboryl)ethane (TSDE)

Boron trichloride (99.9%, Aldrich, 0.1 mol, ~9 mL at −78° C.) was condensed at −65° C. in a round-bottom flask equipped with an addition funnel. Trichlorovinylsilane (97%, Aldrich, 0.1 mol, ~13 mL) was pre-mixed with triethylsilane (99%, Aldrich, 0.1 mol, ~16 mL), and added dropwise to $BCl_3$ over 15 min. The mixture was stirred for one hour and then allowed to warm to room temperature. The reaction mixture was distilled using a Vigreux column at ~40° C./12 mbar to obtain TSDE. The product is a colorless liquid at room temperature and extremely sensitive to moisture and air. (Caution: $BCl_3$ is highly corrosive and should be handled with care.)

EXAMPLE 4

Synthesis of the Preceramic Polymer

TSDE (~0.06 mol) was added dropwise to a solution of ~60 mL of methylamine (anhydrous, 98+%, Aldrich) in ~180 mL of dry hexane (100.0%, A.C.S. reagent, J. T. Baker, Phillipsburg, N.J.) at −65° C. under argon. The mixture was allowed to react overnight under vigorous stirring. After reaction was complete, the mixture was warmed to room temperature, and a white solid was removed by filtration using house vacuum. Hexane was removed by distillation from the filtrate using a rotary evaporator (Model: R110, Büchi) under moderate vacuum (~20 mm Hg). This polymer was heated for 1–2 h at 100° C. under an atmosphere of ammonia, followed by degassing under vacuum (~3 mm Hg) for 30 min. Upon cooling to room temperature, a colorless glassy solid was obtained and stored under argon.

EXAMPLE 5

Fabrication of Microstructures of SiBNC Ceramics

The manipulations were conducted in a glove bag under argon. The fabrication of preceramic microstructures using µTM involves the following steps: (i) Silanized PDMS molds were placed on a hot plate with their structured surface facing upward. The temperature of the hotplate was set at 120° C.; (ii) A flask containing preceramic polymer 1 was heated on the hotplate. After this polymer melted into a viscous liquid, it was transferred onto the top of the molds using a spatula; (iii) After the polymer filled the voids of the PDMS mold, a silanized silicon wafer was placed on the top. A pressure of ~5 psi (~3×10$^4$ Pascals) was applied on the wafer using a weight; (iv) The temperature of the hotplate was then raised to 200° C. at a rate of 2° C./min. The polymer was cured at this temperature for 1 h and cooled to room temperature on the hotplate. An alternative process used vacuum assisted MIMIC. In this method, a PDMS mold was placed directly against the surface of a silanized silicon substrate on a hotplate. The preceramic polymer was melted at 120° C. and transferred to the entrance of the PDMS mold using a spatula. The channels were filled with the polymer by applying vacuum in the channels and by capillary flow. The hotplate was heated to 200° C., held at that temperature for 1 h, and cooled to room temperature.

Once the hotplate was cooled down, we first tried to peel off the PDMS mold from the silanzied substrate and from the preceramic microstructure. The mold could sometimes be removed from the substrate, leaving the preceramic microstructures still attached to the silicon substrate. In these cases, the preceramic structures along with the substrate were transferred into a quartz tube furnace for pyrolysis and condensation. When the PDMS molds could not be peeled off from the polymeric microstructures, we used a 1.0 M TBAF solution in THF (Aldrich) to dissolve the PDMS mold. In this case, the microstructure and the PDMS mold were normally released from the silanized substrate first. The preceramic microstructure became freestanding after the dissolution of the PDMS mold by the TBAF solution. This freestanding preceramic structure was placed on top of a silicon substrate and transferred into the quartz tube furnace for pyrolysis and condensation.

The conversion of polymeric microstructures into ceramics started with the purge of the samples positioned in the center of a quartz tube with argon for ~15 min. The temperature of the furnace (model: TF55035A, Linderberg/Blue) was raised to 1050° C. at a rate of 1° C./min and held for 2 h at that temperature. After the heating, the furnace was cooled to room temperature at a rate of 2° C./min. If the preceramic structures were freestanding, the final ceramic structures could be easily removed from the silicon substrate. Some microstructures that were initially attached to the silanized silicon substrate released spontaneously. The test of thermal stability of the ceramic microstructure was performed using a freestanding microstructure of hexagonal honeycomb grid following a similar heating procedure but in air.

Those skilled in the art would readily appreciate that all parameters listed herein are meant to be exemplary and that actual parameters will depend upon the specific application for which the methods and apparatus of the present invention are used. It is, therefore, to be understood that the foregoing embodiments are presented by way of example only and that, within the scope of the appended claims and equivalents thereto, the invention may be practiced otherwise than as specifically described.

What is claimed is:

1. A method comprising:
   providing a mold having at least one component with at least one dimension less than 100 µm;
   filling the mold with a ceramic precursor;
   heating the ceramic precursor under a moisture-free atmosphere to produce a structure comprising a ceramic, the structure having a Young's modulus that does not change more than 10% upon heating to 1400° C. in an inert atmosphere; and
   removing the mold from a product formed from the ceramic precursor, wherein the step of removing the mold comprises dissolving the mold in a solution containing fluoride ions.

2. The method of claim 1, wherein the ceramic precursor comprises at least two different elements.

3. The method of claim 2, wherein the at least two different elements are selected from a group consisting of carbon; nitrogen, boron, silicon, phosphorus, aluminum and hydrogen.

4. The method of claim 1, wherein the ceramic precursor comprises at least three different elements.

5. The method of claim 1, wherein each element of the ceramic structure is derived from the ceramic precursor.

6. The method of claim 1, wherein the step of heating is performed under an inert atmosphere.

7. The method of claim 1, wherein prior to the step of filling, the ceramic precursor is prepared to have sufficient viscosity to completely fill the mold.

8. The method of claim 7, wherein the viscosity of the ceramic precursor is adjusted to have a value less than about 500 cm$^2$/s.

9. The method of claim 1, wherein prior to the step of filling, the mold is treated such that it is inert with respect to reaction with the ceramic precursor and any subsequent products resulting from the ceramic precursor.

10. The method of claim 9, wherein the step of treating the mold comprises reacting the mold with an agent selected from the group consisting of alkylating, silylating, fluoroalkylating, or alkylsilylating agent.

11. The method of claim 1, wherein the step of filling comprises positioning a surface of the mold against a surface of a substrate to create a cavity which the ceramic precursor fills.

12. The method of claim 11, wherein the substrate is selected from the group consisting of silicon, silicon dioxide, silicon nitride, and any substrate with a smooth metallic surface.

13. The method of claim 11, further comprising treating the substrate surface to render the substrate inert with respect to reaction with the ceramic precursor and any subsequent products resulting from the ceramic precursor.

14. The method of claim 13, wherein the step of treating comprises silanization.

15. The method of claim 1, wherein the step of filling comprises allowing the ceramic precursor to enter a volume of lower pressure.

16. The method of claim 1, wherein the step of filling comprises allowing the ceramic precursor to enter a volume by means of capillary action.

17. The method of claim 1, further comprising the step of curing the ceramic precursor in the mold.

18. The method of claim 17, wherein the ceramic precursor is cured chemically.

19. The method of claim 17, wherein the ceramic precursor is cured thermally.

20. The method of claim 17, wherein the ceramic precursor is cured in the mold at a temperature of at least 100° C.

21. The method of claim 17, wherein the ceramic precursor is cured in the mold under an inert atmosphere.

22. The method of claim 17, wherein the precursor is cured in the mold under a moisture-free atmosphere.

23. The method of claim 1, wherein the solution contains tetrabutylammonium fluoride.

24. The method of claim 1, wherein the product comprises a cured ceramic precursor and after removing the mold, the method further comprises heating the cured ceramic precursor to a temperature of at least 1000° C. to produce a ceramic.

25. The method of claim 1, further comprising transferring the product to a substrate selected from the group consisting of silicon, silicon dioxide, silicon nitride, and metal.

26. The method of claim 1, wherein the ceramic precursor is a single precursor.

27. The method of claim 1, wherein the ceramic precursor comprises a polymer.

28. The method of claim 1, wherein the ceramic precursor comprises an oligomer.

29. The method of claim 1, wherein the mold exhibits elastomeric properties.

30. The method of claim 29, wherein the mold comprises polydialkylsiloxane material.

31. The method of claim 1, wherein the step of filling the mold is performed under an inert atmosphere.

32. The method of claim 1, wherein the step of filling the mold is performed under a moisture-free atmosphere.

33. A method comprising:
providing a mold;
silanizing the mold;
filling the silanized mold with a ceramic precursor; and
dissolvinq the filled mold in a solution containing fluoride ions.

34. A method comprising:
providing a silanized mold having at least one component with at least one dimension less than 100 μm;
providing a ceramic precursor having sufficient viscosity to completely fill the mold, wherein the viscosity of the ceramic precursor is adjusted to have a value of less than about 500 cm$^2$/s;
thereafter, filling the mold with the ceramic precursor, and dissolving the filled mold in a solution containing fluoride ions.

35. A method comprising:
providing a mold having at least one component with at least one dimension less than 100 μm;
reacting the mold with an agent selected from the group consisting of an alkylating, silylating, fluoroalkylating, or alkylsilylating agent, such that the mold is inert with respect to reaction with a ceramic precursor and any subsequent products resulting from the ceramic precursor;
thereafter, filling the mold with the ceramic precursor; and
dissolving the filled mold in a solution containing fluoride ions.

36. A method comprising:
providing a mold having at least one component with at least one dimension less than 100 μm;
positioning a surface of the mold against a surface of a substrate to create a cavity which a ceramic precursor fills;
treating the substrate surface to render the substrate inert with respect to reaction with the ceramic precursor and any subsequent products resulting from the ceramic precursor; and
dissolving the mold containing the ceramic precursor in a solution containing fluoride ions.

37. A method comprising:
providing a silanized mold having at least one component with at least one dimension less than 100 μm;
allowing a ceramic precursor to enter a volume of lower pressure in the mold;
dissolving the mold containing the ceramic precursor in a solution containing fluoride ions.

38. A method comprising:
providing a mold having at least one component with at least one dimension less than 100 μm;
filling the mold with a ceramic precursor;
curing the ceramic precursor in the mold under a moisture-free atmosphere; and
dissolving the mold containing the ceramic precursor in a solution containing fluoride ions.

39. A method comprising:
providing a mold having at least one component with at least one dimension less than 100 μm;
filling the mold with a ceramic precursor; and
dissolving the filled mold in a solution containing fluoride anions.

40. A method comprising:
providing an elastomeric mold comprising polydialkylsiloxane material having at least one component with at least one dimension less than 100 μm;
filling the mold with a ceramic precursor;
heating the ceramic precursor in the mold to produce a structure comprising a ceramic, the structure having a Young's modulus that does not change more than 10% upon heating to 1400° C. in an inert atmosphere; and
dissolving the mold containing the heated ceramic precursor in a solution containing fluoride anions.

41. The method of claim 33, further comprising heating the ceramic precursor to produce a structure comprising a ceramic.

42. The method of claim 33, further comprising the step of curing the ceramic precursor in the mold.

43. The method of claim 42, wherein the ceramic precursor is cured in the mold under an inert and/or a moisture-free atmosphere.

44. The method of claim 34, further comprising heating the ceramic precursor in the mold to produce a structure comprising ceramic.

45. The method of claim 34, further comprising the step of curing the ceramic precursor in the mold.

46. The method of claim 45, wherein the ceramic precursor is cured in the mold under an inert and/or a moisture-free atmosphere.

47. The method of claim 35, further comprising heating the ceramic precursor in the mold to produce a structure comprising ceramic.

48. The method of claim 35, further comprising the step of curing the ceramic precursor in the mold.

49. The method of claim 48, wherein the ceramic precursor is cured in the mold under an inert and/or a moisture-free atmosphere.

50. The method of claim 36, further comprising heating the ceramic precursor to produce a structure comprising a ceramic.

51. The method of claim 36, further comprising the step of curing the ceramic precursor in the mold.

52. The method of claim 51, wherein the ceramic precursor is cured in the mold under an inert and/or a moisture-free atmosphere.

53. The method of claim 37, further comprising heating the ceramic precursor to produce a structure comprising a ceramic.

54. The method of claim 37, further comprising the step of curing the ceramic precursor in the mold.

55. The method of claim 54, wherein the ceramic precursor is cured in the mold under an inert and/or a moisture-free atmosphere.

56. The method of claim 38, further comprising heating the ceramic precursor to produce a structure comprising a ceramic.

57. The method of claim 38, wherein the ceramic precursor is cured in the mold under an inert atmosphere.

58. The method of claim 39, further comprising heating the ceramic precursor to produce a structure comprising a ceramic.

59. The method of claim 39, further comprising the step of curing the ceramic precursor in the mold.

60. The method of claim 59, wherein the ceramic precursor is cured in the mold under an inert and/or a moisture-free atmosphere.

61. The method of claim 40, further comprising the step of curing the ceramic precursor in the mold.

62. The method of claim 61, wherein the ceramic precursor is cured in the mold under a moisture free atmosphere.

* * * * *